(12) United States Patent
Kawashima et al.

(10) Patent No.: US 8,618,632 B2
(45) Date of Patent: Dec. 31, 2013

(54) SEMICONDUCTOR DEVICE AND MULTI-LAYERED WIRING SUBSTRATE

(75) Inventors: Tetsuya Kawashima, Tokai (JP); Takayuki Hashimoto, Tokai (JP)

(73) Assignee: Renesas Electronics Corporation, Kanagawa (JP)

( * ) Notice: Subject to any disclaimer, the term of this patent is extended or adjusted under 35 U.S.C. 154(b) by 317 days.

(21) Appl. No.: 13/041,778

(22) Filed: Mar. 7, 2011

(65) Prior Publication Data
US 2011/0220979 A1  Sep. 15, 2011

(30) Foreign Application Priority Data
Mar. 10, 2010 (JP) .................... 2010-053108

(51) Int. Cl.
*H01L 23/52* (2006.01)
*H05K 1/14* (2006.01)

(52) U.S. Cl.
USPC ............ 257/532; 257/774; 257/E23.144; 361/784

(58) Field of Classification Search
USPC ............ 257/E23.144, E23.146, 532, 774; 361/784, 794
See application file for complete search history.

(56) References Cited

U.S. PATENT DOCUMENTS

| | | | | |
|---|---|---|---|---|
| 5,719,750 | A | * | 2/1998 | Iwane .......................... 361/794 |
| 7,291,896 | B2 | * | 11/2007 | Nair .............................. 257/533 |
| 7,428,155 | B2 | * | 9/2008 | Nakao .......................... 361/794 |
| 7,466,560 | B2 | * | 12/2008 | Hayashi et al. ............... 361/784 |
| 7,679,930 | B2 | * | 3/2010 | Hayashi et al. ............... 361/784 |
| 7,929,315 | B2 | * | 4/2011 | Hayashi et al. ............... 361/784 |
| 2005/0161785 | A1 | | 7/2005 | Kawashima et al. |
| 2007/0290324 | A1 | | 12/2007 | Kikuchi |

FOREIGN PATENT DOCUMENTS

| | | |
|---|---|---|
| JP | 2003-297963 A | 10/2003 |
| JP | 2005-217072 A | 8/2005 |
| JP | 2006-210748 A | 8/2006 |
| JP | 2007-035843 A | 2/2007 |
| JP | 2008-021969 A | 1/2008 |
| JP | 2008-270369 A | 11/2008 |

* cited by examiner

*Primary Examiner* — Colleen Matthews
(74) *Attorney, Agent, or Firm* — Mattingly & Malur, PC (57) ABSTRACT

There is provided a semiconductor device in which a wiring inductance of a DC/DC converter formed on a multi-layered wiring substrate can be reduced and the characteristics can be improved. In the semiconductor device, in an input-side capacitor, one capacitor electrode is electrically connected to a power-supply pattern between a control power MOSFET and a synchronous power MOSFET, and the other capacitor electrode is electrically connected to a ground pattern therebetween. The multi-layered wiring substrate includes: a via conductor arranged at a position of the one capacitor electrode for electrically connecting among a plurality of power-supply patterns in a thickness direction; and a via conductor arranged at a position of the other capacitor electrode for electrically connecting among a plurality of ground patterns in a thickness direction.

4 Claims, 7 Drawing Sheets

PRIOR ART

SEMICONDUCTOR DEVICE AND MULTI-LAYERED WIRING SUBSTRATE

CROSS-REFERENCE TO RELATED APPLICATION

The present application claims priority from Japanese Patent Application No. 2010-53108 filed on Mar. 10, 2010, the content of which is hereby incorporated by reference into this application.

TECHNICAL FIELD OF THE INVENTION

The present invention relates to a semiconductor device comprising a multi-layered wiring substrate mounting a semiconductor chip such as a transistor and a capacitor. More particularly, the present invention relates to a technique of reducing an inductance of a current loop generated by the semiconductor chip and the capacitor.

BACKGROUND

In a semiconductor device operated as a DC/DC converter, in which two semiconductor chips and a passive component such as a capacitor are mounted on a multi-layered wiring substrate, in taking consideration of reducing a mounting area, the semiconductor chips are mounted on a main surface of the multi-layered wiring substrate, and the capacitor is mounted between a power-supply pattern and a ground pattern on a rear surface, thereof in many cases (see, for example, Japanese Patent Application Laid-Open Publication No. 2003-297963 (Patent Document 1)).

Figure 5:
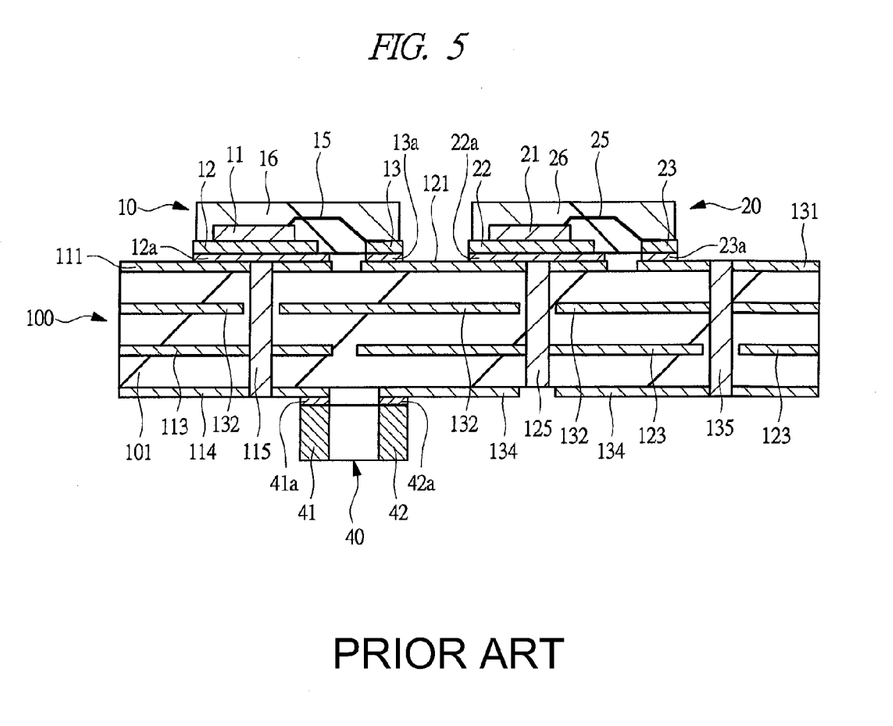
FIG. 5 is a cross-sectional view illustrating a configuration of a conventional semiconductor device which is a comparison example of the semiconductor device according to the first embodiment of the present invention.

For example, this conventional mounting method is as illustrated in FIG. 5. FIG. 5 is a cross-sectional view illustrating a cross-sectional surface of a conventional semiconductor device.

In this case, as illustrated in FIG. 5, via conductors 115, 125, and 135 for connecting a main surface of a multi-layered wiring substrate 100 and a rear surface thereof are used for heat release of a semiconductor chip (for example, power MOSFET packages 10 and 20) on the main surface, and therefore, the via conductors are arranged at positions away from a capacitor 40, such as a position below the semiconductor chip and a position outside the semiconductor chip.

SUMMARY

A non-insulating DC/DC converter widely used for power supplies of a CPU in a personal computer and others includes: control and synchronous power MOSFETs (metal oxide semiconductor field effect transistors); a driver IC (integrated circuit) for turning ON/OFF these power MOSFETs; and other components such as a choke coil and a capacitor.

When such a non-insulating DC/DC converter is formed on a wiring substrate, in many cases, a multi-layered wiring substrate is used for reducing a mounting area, and two power MOSFETs are mounted on a main surface of the multi-layered wiring substrate, and an input-side capacitor is mounted between a power-supply pattern and a ground pattern on a rear surface thereof.

On the other hand, in order to improve the efficiency of such a non-insulating DC/DC converter, it is required to reduce an inductance of a current loop generated by the two power MOSFETs and the input-side capacitor.

However, as described above, when the power MOSFETs and the input-side capacitor are mounted on both surfaces of the substrate, via conductors for electrically connecting between the main surface and the rear surface are included in a current path, and therefore, an inductance of this case is larger than that of a case of mounting on the same surface, and various problems such as increase in a switching loss and in a peak voltage arise from influence of the large inductance.

Accordingly, a preferred aim of the present invention is to provide a semiconductor device in which a wiring inductance of a DC/DC converter formed on a multi-layered wiring substrate can be reduced to achieve performance improvement.

The above and other preferred aims and novel characteristics of the present invention will be apparent from the description of the present specification and the accompanying drawings.

The typical ones of the inventions disclosed in the present application will be briefly described as follows.

That is, the typical one is summarized that, a multi-layered wiring substrate includes: a first-potential wiring layer formed on at least a main surface of the multi-layered wiring substrate and a rear surface thereof; a third-potential wiring layer formed on each of the main surface thereof, the rear surface thereof, and an inner layer thereof; a second-potential wiring layer formed on at least the main surface; at least one first-potential via conductor for electrically connecting among a plurality of the first-potential wiring layers in a thickness direction; and at least one third-potential via conductor for electrically connecting among a plurality of the third-potential wiring layers in a thickness direction. And, in an input-side capacitor on the rear surface of the multi-layered wiring substrate, a first capacitor electrode is electrically connected to the first-potential wiring layer between a first transistor and a second transistor, and a second capacitor electrode is electrically connected to the third-potential wiring layer therebetween. The multi-layered wiring substrate includes: a via conductor for the first-potential capacitor arranged at a position of the first capacitor electrode for electrically connecting among a plurality of the first-potential wiring layers in a thickness direction; and a via conductor for the third-potential capacitor arranged at a position of the second capacitor electrode for electrically connecting among a plurality of the third-potential wiring layers in a thickness direction.

The effect obtained by typical aspects of the present invention will be briefly described below.

That is, as the effect obtained by typical aspects, by arranging via conductors at a position of a capacitor electrode of an input-side capacitor between two transistors, opposite current paths can be adjacent to each other, and therefore, an inductance of a current loop generated by the two transistors and the input-side capacitor can be reduced, so that a switching loss and a peak voltage can be reduced.

DETAILED DESCRIPTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Further, in the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

First Embodiment

Figure 1:
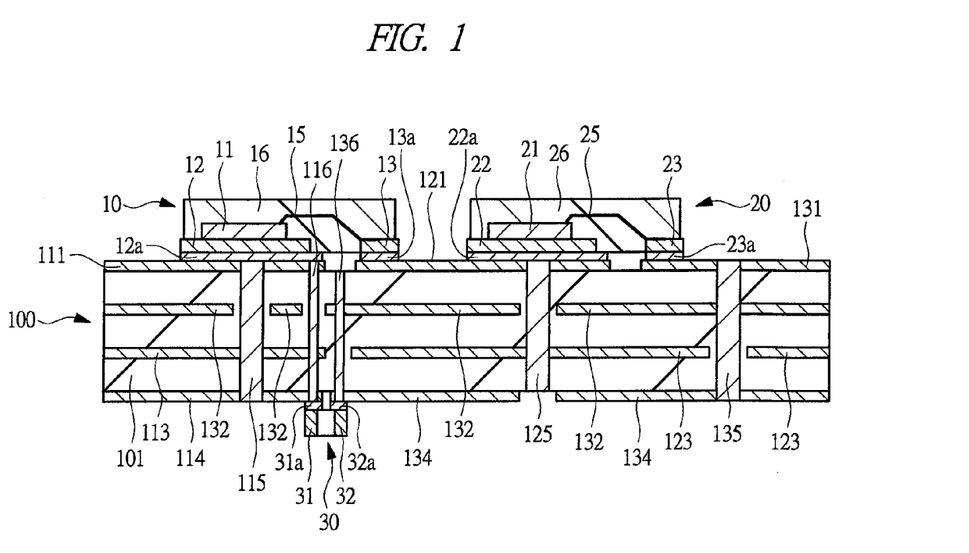
FIG. 1 is a cross-sectional view illustrating a configuration of a semiconductor device according to a first embodiment of the present invention.
Figure 2A:
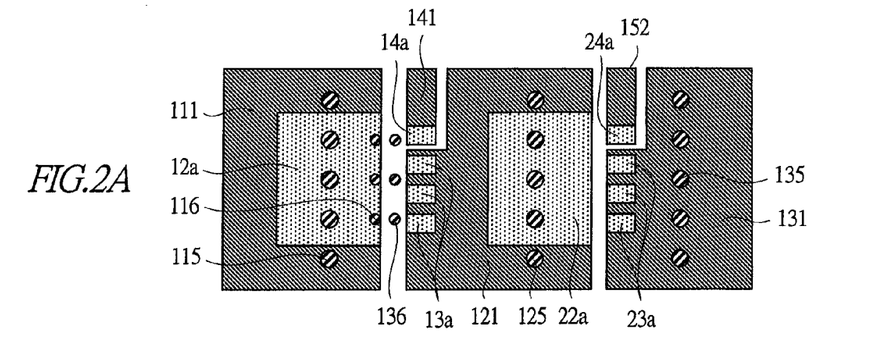
FIG. 2A is a plan view illustrating a pattern shape of each wiring layer of a multi-layered wiring substrate configuring the semiconductor device according to the first embodiment of the present invention.
Figure 2B:
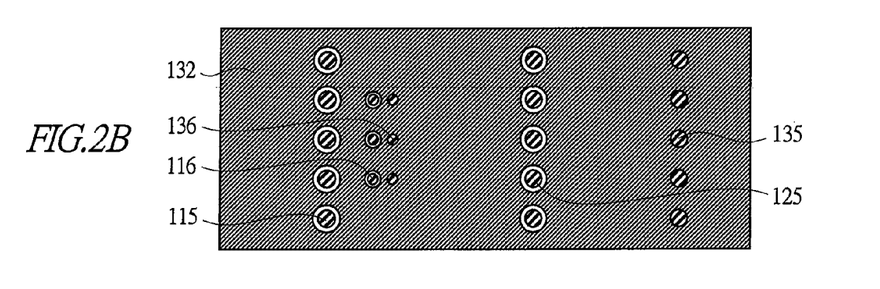
FIG. 2B is a plan view illustrating a pattern shape of each wiring layer of a multi-layered wiring substrate configuring the semiconductor device according to the first embodiment of the present invention.
Figure 2C:
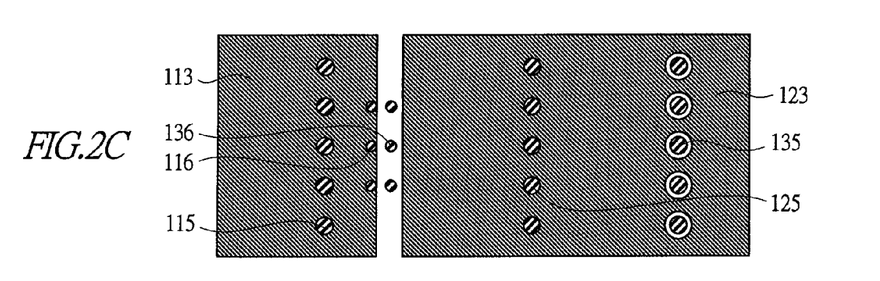
FIG. 2C is a plan view illustrating a pattern shape of each wiring layer of a multi-layered wiring substrate configuring the semiconductor device according to the first embodiment of the present invention.
Figure 2D:
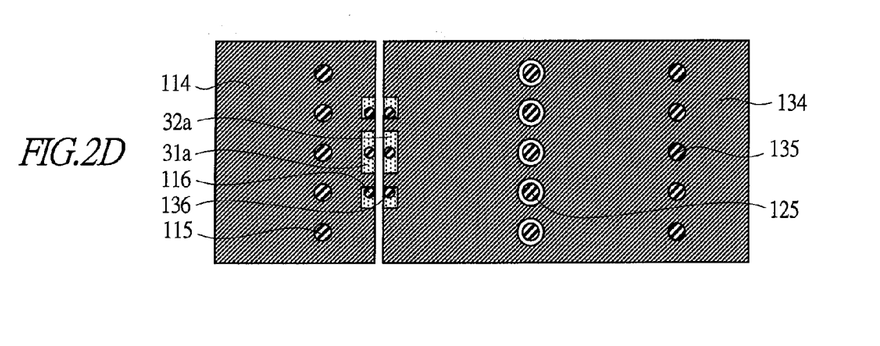
FIG. 2D is a plan view illustrating a pattern shape of each wiring layer of a multi-layered wiring substrate configuring the semiconductor device according to the first embodiment of the present invention.
Figure 3:
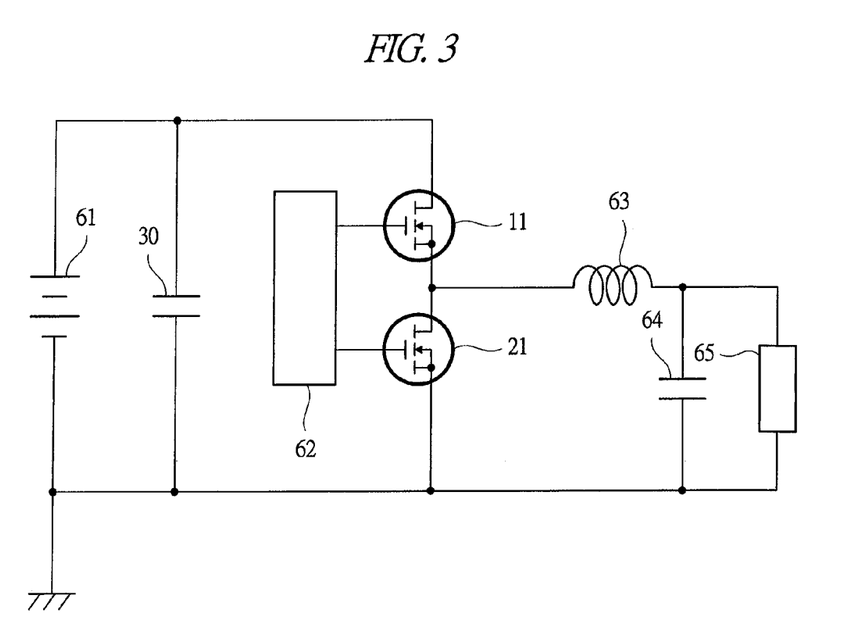
FIG. 3 is a diagram illustrating a circuit configuration of a non-insulating DC/DC converter with using the semiconductor device according to the first embodiment of the present invention.

With reference to FIGS. 1 to 3, a configuration of a semiconductor device according to a first embodiment of the present invention is described. FIG. 1 is a cross-sectional view illustrating the configuration of the semiconductor device according to the first embodiment of the present invention, and this illustrates an example of a non-insulating DC/DC converter. FIGS. 2A to 2D are plan views each illustrating a pattern shape of each wiring layer of a multi-layered wiring substrate configuring the semiconductor device according to the first embodiment of the present invention, and FIG. 2A illustrates a wiring layer on a main surface of the multi-layered wiring substrate, each of FIGS. 2B and 2C illustrates a wiring layer on an inner layer of the multi-layered wiring substrate, and FIG. 2D illustrates a wiring layer on a rear surface of the multi-layered wiring substrate. FIG. 3 is a diagram illustrating a circuit configuration of a non-insulating DC/DC converter with using the semiconductor device according to the first embodiment of the present invention.

In FIGS. 1 to 2D, a basic structure of the semiconductor device includes: two power MOSFET packages 10 and 20 in which a control power MOSFET (first transistor) 11 and a synchronous power MOSFET (second transistor) 21, which configure the DC/DC converter, are sealed by insulating resins 16 and 26; an input-side capacitor 30; and a multi-layered wiring substrate 100 on which these components are mounted. The descriptions for other components such as a passive component and driver IC are omitted.

Note that the two power MOSFET packages 10 and 20 are mounted on the main surface of the multi-layered wiring substrate 100, and the input-side capacitor 30 is mounted on the rear surface thereof.

Also, the control power MOSFET 11 is mounted on a power-supply pattern (first-potential wiring layer) 111 on the main surface of the multi-layered wiring substrate 100 so as to interpose a land 12a and a drain-side lead 12 therebetween, and the synchronous power MOSFET 21 is mounted on an output pattern (second-potential wiring layer) 121 thereon so as to interpose a land 22a and a drain-side lead 22.

A drain terminal (first transistor electrode) is formed on rear surfaces of semiconductor chips where the control power MOSFET 11 and the synchronous power MOSFET 21 are formed, and a source terminal (second transistor electrode) and a gate terminal (third transistor electrode) are formed on a main surface of semiconductor chips where the control power MOSFET 11 and the synchronous power MOSFET 21 are formed.

The source terminal of the control power MOSFET 11 is connected to the output pattern 121 by a wire-like, ribbon-like, or plate-like conductor 15 so as to interpose a source-side lead 13 and a source-side land 13a.

Also, the gate terminal of the control power MOSFET 11 is connected to a gate wiring layer 141 on the main surface of the multi-layered wiring substrate 100 by a wire-like, ribbon-like, or plate-like conductor (not illustrated) so as to interpose a gate-side lead (not illustrated) and a land 14a.

Further, the source terminal of the synchronous power MOSFET 21 is connected to the ground pattern (third-potential wiring layer) 131 on the main surface of the multi-layered wiring substrate 100 by a wire-like, ribbon-like, or plate-like conductor 25 so as to interpose a source-side lead 23 and a land 23a.

Still further, the gate terminal of the synchronous power MOSFET 21 is connected to a gate wiring layer 152 on the main surface of the multi-layered wiring substrate 100 by a wire-like, ribbon-like, or plate-like conductor (not illustrated) so as to interpose a source-side lead (not illustrated) and a land 24a.

On the other hand, a power-supply pattern 114 and a ground pattern 134 exist on the rear surface of the multi-layered wiring substrate 100, one electrode (first capacitor electrode) 31 of the capacitor 30 is connected to the power-supply pattern 114 so as to interpose a land 31a, and the other electrode (second capacitor electrode) 32 thereof is connected to the ground pattern 134 so as to interpose a land 32a.

Also, in the inner layer of the multi-layered wiring substrate 100, the power-supply pattern 113, the output pattern 123, and the ground pattern 132 exist. More particularly, it is desirable to widely arrange the ground (third-potential) pattern close to a surface wiring. Further, between layers of the inner layer of the multi-layered wiring substrate 100, an insulating material 101 is provided.

Still further, right below the control power MOSFET 11 and the synchronous power MOSFET 21, via conductors 115 and 125 are arranged, respectively. A first-potential via conductor 115 electrically connects among the power-supply patterns 111, 113, and 114, and a second-potential via conductor 125 electrically connects between the output patterns 121 and 123.

In addition, a third-potential via conductor 135 is arranged on the ground pattern 131 on a surface to electrically connect between the ground patterns 132 and 134.

Moreover, via conductors (via conductors for the capacitor) 116 and 136 are arranged between the control power MOSFET 11 and the synchronous power MOSFET 21. A first-potential via conductor 116 electrically connects among the power-supply patterns 111, 113, and 114, and a third-potential via conductor 136 electrically connects between the ground patterns 132 and 134.

As described above, in the present embodiment, in addition to the via conductors 115, 125, and 135, the via conductors 116 and 136 are provided at the position where the input-side capacitor 30 is mounted. In this manner, the current path through the input-side capacitor 30 is shortened, so that the inductance of the current loop generated by the input-side capacitor 30 and the two power MOSFETs of the control power MOSFET 11 and the synchronous power MOSFET 21 can be reduced.

Note that cross-sectional areas of the via conductors 116 and 136 existing between the control power MOSFET 11 and the synchronous power MOSFET 21 may be smaller than those of other via conductors 115, 125, and 135.

This is because the via conductors 115 and 125 right below the chips also play a role of transferring heat generated at the chips to other wiring layers (for example, the power-supply pattern 113 and the output pattern 123), and therefore, the larger cross-sectional area is more advantageous. Also, this is because a high-frequency current flowing in the path having a low inductance through the via conductors 116 and 136 is relatively small, and therefore, even if they have small cross-sectional areas, they have less problems such as increase in Joule loss than the via conductors 115 and 135 in which a large current is constantly flown.

Also, it is not required to shape the cross-sectional surfaces of the via conductors 115, 116, 125, 135, and 136 as a circular shape, and the cross-sectional surfaces may be shaped as a hollow through-hole shape.

In addition, in order to obtain the more effect of reducing the inductance, two types of the capacitors 30 whose sizes and capacitances are different from each other may be parallely used as the input capacitor.

Further, when a relatively-large capacitor is used as the capacitor 30, it is considered that a distance between the via conductors 116 and 136 between the chips is shorter than a distance between terminals of the relatively-large capacitor, and, in this case, the current path is lengthened, and therefore, the inductance is increased.

Accordingly, even when the capacitors whose capacitances are different from each other are used, by using a smaller capacitor 30 in accordance with the distance between the via conductors 116 and 136 between the chips, the more effect of reducing the wiring inductance can be achieved.

In FIG. 3, in a circuit configuration of the non-insulating DC/DC converter with using the semiconductor device, the control power MOSFET 11 and the synchronous power MOSFET 21 are connected to a driver IC 62, a coil 63, capacitors 30 and 64, and a load 65, an input power supply 61, and others by wirings.

In the present embodiment, the non-insulating Dc/DC converter as illustrated in FIG. 3 is configured with using the multi-layered wiring substrate 100 as illustrated in FIGS. 1 and 2. Therefore, with using the multi-layered wiring substrate 100, even when the control power MOSFET 11 and the synchronous power MOSFET 21 are mounted on the main surface of the multi-layered wiring substrate 100 and the input-side capacitor 30 is mounted on the rear surface of the multi-layered wiring substrate 100, the wiring inductance of the DC/DC converter can be reduced, so that the characteristics can be improved.

Also, in the example illustrated in FIG. 1, all of the via conductors are penetrated through the multi-layered wiring substrate 100. However, as illustrated in FIG. 4, it is not required to penetrate each of the via conductors through the multi-layered wiring substrate 100.

Figure 4:
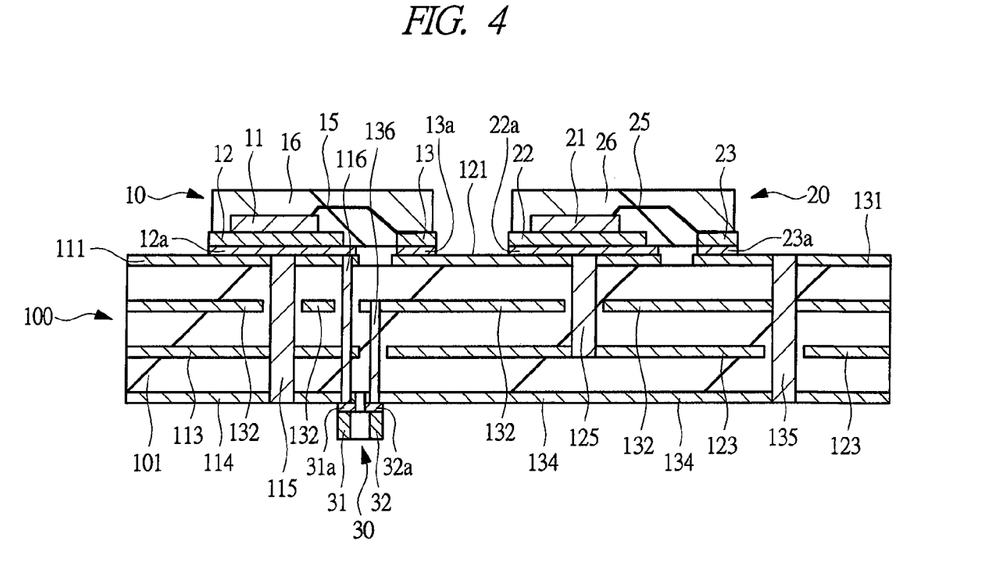
FIG. 4 is a cross-sectional view illustrating a configuration of a different connection structure of the semiconductor device according to the first embodiment of the present invention.

FIG. 4 illustrates an example that the via conductors 136 and 125 are not penetrated through the multi-layered wiring substrate 100.

FIG. 4 is a cross-sectional view illustrating a configuration of a different connection structure of the semiconductor device according to the present embodiment.

Also, it is not required to connect all of the same potential patterns by one via conductor, and may be by a plurality of vias.

Next, with reference to FIG. 5, a configuration of a conventional semiconductor device which is a comparison example of the semiconductor device according to the first embodiment of the present invention is described. FIG. 5 is a cross-sectional view illustrating the configuration of the conventional semiconductor device which is the comparison example of the semiconductor device according to the first embodiment of the present invention.

As illustrated in FIG. 5, in the conventional semiconductor device, an input-side capacitor 40 is mounted on the rear surface of the multi-layered wiring substrate 100. One electrode 41 of the input-side capacitor 40 is connected the power-supply pattern 114 so as to interpose a land 41*a*, and the other electrode 42 thereof is connected the ground pattern 134 so as to interpose a land 42*a*.

And, in FIG. 5, since the via conductors 116 and 136 between the chips as illustrated in FIG. 1 do not exist, a current path generated by the control power MOSFET 11, the synchronous power MOSFET 21, and the input-side capacitor 40 includes the via conductors 115 and 135, and therefore, the current path is formed as a wide loop, and the inductance is increased compared to that of the present embodiment.

Second Embodiment

In the first embodiment, the control power MOSFET 11 and the synchronous power MOSFET 21 are individually sealed to configure the power MOSFET packages 10 and 20, respectively. However, in the second embodiment, the control power MOSFET 11 and the synchronous power MOSFET 21 are sealed to configure one package as a 2-in-1 package 50.

Figure 6:
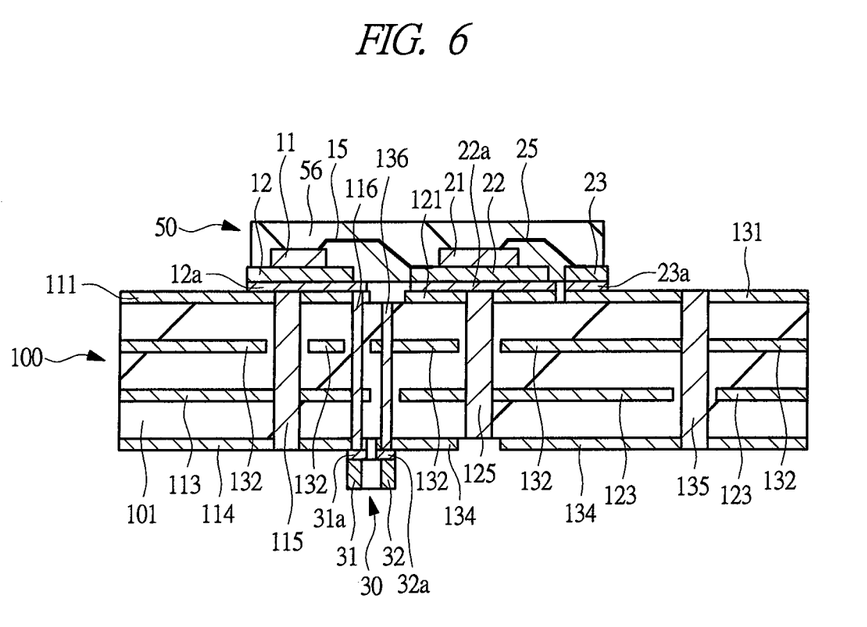
FIG. 6 is a cross-sectional view illustrating a configuration of a semiconductor device according to a second embodiment of the present invention.

With reference to FIG. 6, a configuration of a semiconductor device according to a second embodiment of the present invention is described. FIG. 6 is a cross-sectional view illustrating the configuration of the semiconductor device according to the second embodiment of the present invention, and shows an example that the 2-in-1 package is used.

In FIG. 6, the control power MOSFET 11 and the synchronous power MOSFET 21 are sealed as one 2-in-1 package 50, and are mounted on the main surface of the multi-layered wiring substrate 100.

Other basic structures are the same as the structures with using the individual power MOSFET packages 10 and 20 as illustrated in FIG. 1 in the first embodiment, so that, similarly to the first embodiment, the wiring inductance of the DC/DC converter can be reduced, and the characteristics can be achieved.

Note that a configuration with using a package-embedded substrate can be used, the package-embedded substrate being formed such that the two power MOSFETs of the control power MOSFET 11 and the synchronous power MOSFET 21 and the multi-layered wiring substrate 100 are sealed inside a package.

Third Embodiment

In the second embodiment, the control power MOSFET 11 and the synchronous power MOSFET 21 are mounted in the same direction. However, in a third embodiment, the synchronous power MOSFET 21 is mounted up side down compared to that in the second embodiment.

Figure 7:
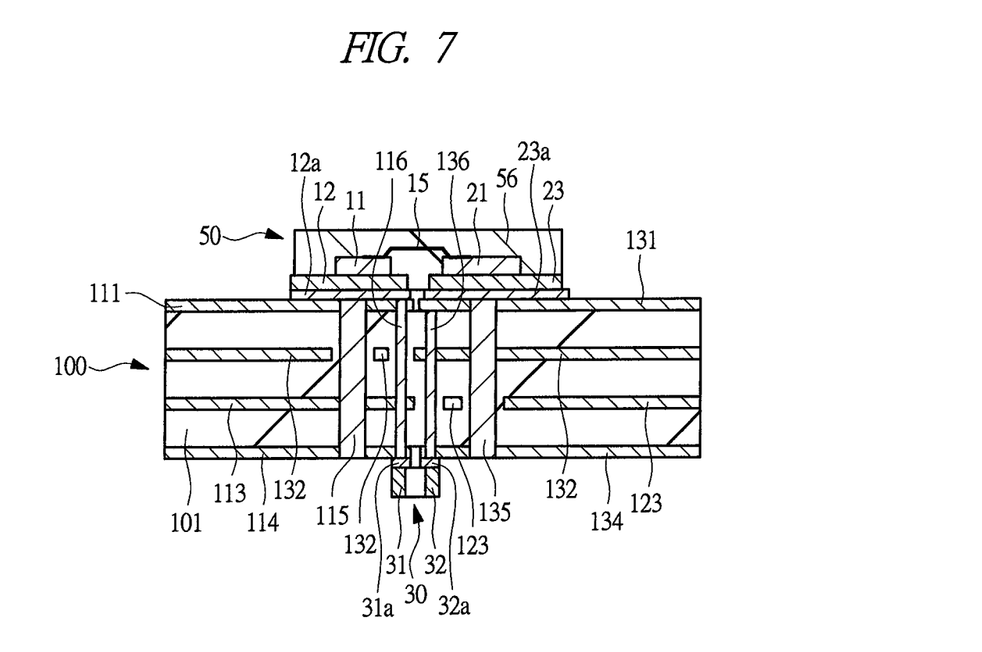
FIG. 7 is a cross-sectional view illustrating a configuration of a semiconductor device according to a third embodiment of the present invention.

With reference to FIG. 7, a configuration of a semiconductor device according to the third embodiment of the present invention is described. FIG. 7 is a cross-sectional view illustrating the configuration of the semiconductor device according to the third embodiment of the present invention.

In FIG. 7, the synchronous power MOSFET 21 is mounted up side down compared to that in the second embodiment. In this manner, the via conductor below the synchronous power MOSFET 21 becomes the third-potential via conductor 135. Other configurations are the same as those of the second embodiment.

In FIG. 7, on the power-supply pattern 111 on the main surface of the multi-layered wiring substrate 100, the control power MOSFET 11 is mounted so as to interpose a land 12a and a drain-side lead 12. On the ground pattern 131, the synchronous power MOSFET 21 is mounted so as to interpose a land 23a and a source-side lead 23.

A drain terminal is formed on a rear surface of the semiconductor chip where the control power MOSFET 11 is formed, and a source terminal and a gate terminal are formed on a main surface of the semiconductor chip where the control power MOSFET 11 is formed. A source terminal and a gate terminal are formed on a rear surface of the semiconductor chip where the synchronous power MOSFET 21 is formed, and a drain terminal is formed on a main surface of the semiconductor chip where the synchronous power MOSFET 21 is formed.

The source terminal of the control power MOSFET 11 is connected to the drain terminal of the synchronous power MOSFET 21 by a wire-like, ribbon-like, or plate-like conductor 15.

By such a structure, a position of the third-potential via conductor 136 can be arranged inside the ground pattern 131 on the surface side, and therefore, the mounting are can be further reduced than those of the first and second embodiments.

In the foregoing, the invention made by the inventors has been concretely described based on the embodiments. However, it is needless to say that the present invention is not limited to the foregoing embodiments and various modifications and alterations can be made within the scope of the present invention.

The present invention relates to a semiconductor device formed of a multi-layered wiring substrate including a semiconductor chip such as a transistor and a capacitor, and can be widely used for a device in which an inductance of a current loop generated by the semiconductor chip and the capacitor is required.

What is claimed is:

1. A semiconductor device comprising:
   a multi-layered wiring substrate having a main surface, a rear surface, and at least one inner layer;
   first and second transistors each having first, second, and third transistor electrodes and mounted on the main surface of the multi-layered wiring substrate; and
   at least one input-side capacitor having first and second capacitor electrodes and mounted on the rear surface of the multi-layered wiring substrate,
   wherein the multi-layered wiring substrate includes:
   first wiring layers to be supplied with a first potential formed on at least the main surface and the rear surface;
   a second wiring layer to be supplied with a second potential formed on at least the main surface;
   third wiring layers to be supplied with a third potential formed on each of the main surface, the rear surface, and the inner layer;
   at least one first via conductor for electrically connecting among the first wiring layers in a thickness direction of the multi-layered wiring substrate; and
   at least one second via conductor for electrically connecting among the third wiring layers in the thickness direction,
   wherein the first transistor is mounted on the first wiring layer on the main surface so that the first transistor electrode of the first transistor is electrically connected to the first wiring layer on the main surface, and the second transistor electrode of the first transistor is electrically connected to the second wiring layer on the main surface,
   wherein the second transistor is mounted on the second wiring layer on the main surface so that the first transistor electrode of the second transistor is electrically connected to the second wiring layer on the main surface, and the second transistor electrode of the second transistor is electrically connected to the third wiring layer on the main surface,
   wherein the first capacitor electrode of the input-side capacitor is electrically connected to the first wiring layer, and the second capacitor electrode of the input-side capacitor is electrically connected to the third wiring layer, and
   the multi-layered wiring substrate includes:
   a third via conductor for the input-side capacitor arranged at a position of the first capacitor electrode and for electrically connecting among the first wiring layers in the thickness direction; and
   a fourth via conductor for the input-side capacitor arranged at a position of the second capacitor electrode and for electrically connecting among the third wiring layers in the thickness direction, and
   the first via conductor being arranged directly below the first transistor, and a cross-sectional area of the first via conductor being larger than cross-sectional areas of the via conductor for the input-side capacitor and the via conductor for the input-side capacitor.

2. The semiconductor device according to claim 1, wherein the second transistor electrode and the third transistor electrode of each of the first transistor and the second transistor are formed on a main surface of a semiconductor chip where each of the first transistor and the second transistor is formed, and the first transistor electrode of each of the first transistor and the second transistor is formed on a rear surface of the semiconductor chip where each of the first transistor and the second transistor is formed.

3. A semiconductor device comprising:
a multi-layered wiring substrate having a main surface, a rear surface, and at least one inner layer;
first and second transistors each having first, second, and third transistor electrodes and mounted on the main surface of the multi-layered wiring substrate; and
at least one input-side capacitor having first and second capacitor electrodes and mounted on the rear surface of the multi-layered wiring substrate,
wherein the multi-layered wiring substrate includes:
first wiring layers to be supplied with a first potential formed on at least the main surface and the rear surface;
a second wiring layer to be supplied with a second potential formed on at least the main surface;
third wiring layers to be supplied with a third potential formed on each of the main surface, the rear surface, and the inner layer;
at least one first via conductor for electrically connecting among the first wiring layers in a thickness direction of the multi-layered wiring substrate; and
at least one second via conductor for electrically connecting among the third wiring layers in the thickness direction,
wherein the first transistor is mounted on the first wiring layer on the main surface so that the first transistor electrode of the first transistor is electrically connected to the first wiring layer on the main surface, and the second transistor electrode of the first transistor is electrically connected to the second wiring layer on the main surface,
wherein the second transistor is mounted on the second wiring layer on the main surface so that the first transistor electrode of the second transistor is electrically connected to the second wiring layer on the main surface, and the second transistor electrode of the second transistor is electrically connected to the third wiring layer on the main surface,
wherein the first capacitor electrode of the input-side capacitor is electrically connected to the first wiring layer, and the second capacitor electrode of the input-side capacitor is electrically connected to the third wiring layer, and
the multi-layered wiring substrate includes:
a third via conductor for the input-side capacitor arranged at a position of the first capacitor electrode and for electrically connecting among the first wiring layers in the thickness direction; and
a fourth via conductor for the input-side capacitor arranged at a position of the second capacitor electrode and for electrically connecting among the third wiring layers in the thickness direction,
at least one fifth via conductor for electrically connecting among the second wiring layers in the thickness direction,
the at least one fifth via conductor arranged directly below the second transistor, and
wherein a cross-sectional area of the at least one fifth via conductor is larger than cross-sectional areas of the third via conductor for the input-side capacitor and the fourth via conductor for the input-side capacitor.

4. A multi-layered wiring substrate comprising: a main surface; a rear surface; and at least one inner layer, first and second transistor being mounted on the main surface, and at least one input-side capacitor, which has first and second capacitor electrodes, being mounted on the rear surface,
wherein the multi-layered wiring substrate includes:
first wiring layers to be supplied with a first potential formed on at least the main surface and the rear surface;
a wiring layer to be supplied with a second potential formed on at least the main surface;
third wiring layers to be supplied with a third potential formed on each of the main surface, the rear surface, and the inner layer;
at least one first via conductor for electrically connecting among the first wiring layers in a thickness direction of the multi-layered wiring substrate; and
at least one second via conductor for electrically connecting among the third wiring layers in the thickness direction,
wherein the first capacitor electrode of the input-side capacitor is electrically connected to the first wiring layer, and the second capacitor electrode of the input-side capacitor is electrically connected to the third wiring layer, and
the multi-layered wiring substrate includes:
a third via conductor for the input-side capacitor arranged at a position of the first capacitor electrode and for electrically connecting among the first-potential wiring layers in the thickness direction; and
a fourth via conductor for the input-side capacitor arranged at a position of the second capacitor electrode and for electrically connecting among the wiring layers in the thickness direction,
wherein cross-sectional areas of the first via conductor and the second via conductor are larger than cross-sectional areas of the third via conductor and the fourth via conductor.

* * * * *